United States Patent [19]

Katoh et al.

[11] Patent Number: 4,763,072
[45] Date of Patent: Aug. 9, 1988

[54] MAGNETIC AZIMUTH DETECTOR

[75] Inventors: Mitsuru Katoh; Shin-Ichi Kawada; Isao Masuzawa, all of Kuroiso, Japan

[73] Assignee: Kabushikikaisha Tokyo Keiki, Tokyo, Japan

[21] Appl. No.: 869,003

[22] Filed: May 30, 1986

[30] Foreign Application Priority Data

Jun. 7, 1985 [JP] Japan .................................. 60-123905
Jun. 7, 1985 [JP] Japan .................................. 60-123906
May 26, 1986 [JP] Japan .................................. 61-120693

[51] Int. Cl.[4] .......................................... G01R 33/04
[52] U.S. Cl. ..................................... 324/253; 33/361; 336/198; 336/229; 324/260; 324/262
[58] Field of Search ............... 324/207, 208, 222, 223, 324/224–228, 236, 239, 241, 244, 253–255, 260–262; 336/198, 229, 180–182, 185; 33/361

[56] References Cited

U.S. PATENT DOCUMENTS

| | | | |
|---|---|---|---|
| 1,784,833 | 12/1930 | Hagemann | 336/198 X |
| 1,897,604 | 2/1933 | Clemons | 336/198 X |
| 3,564,708 | 2/1971 | Harris | 336/229 X |
| 3,678,593 | 7/1972 | Baker et al. | 33/361 |
| 4,649,639 | 3/1987 | Mas | 336/229 X |

Primary Examiner—Reinhard J. Eisenzopf
Assistant Examiner—Warren S. Edmonds
Attorney, Agent, or Firm—Murray Schaffer

[57] ABSTRACT

A magnetic sensor including an annular iron core, an annular hollow bobbin for a primary winding which incorporates therein the annular iron core, the bobbin having a plurality of protruded portions which are arranged along a circumference of the annular bobbin with an equal distance, each of the protruded portions being extended in a direction parallel to a center axis of the annular iron core, the primary winding being wound on the annular bobbin at respective portions between adjacent protruded portions with an equal number of turns, a bobbin for a secondary winding having a positioning means for the primary winding in association with the protruded portions of the bobbin for the primary winding when the bobbins for the primary and secondary windings are assembled, the secondary winding being wound on the bobbin to form more than two pairs of winding groups.

5 Claims, 7 Drawing Sheets

MAGNETIC AZIMUTH DETECTOR

BACKGROUND OF THE INVENTION

1. Field of the Invention

The present invention relates to a magnetic sensor.

2. Description of the Prior Art

Generally, the magnetic sensor to which the present invention is directed includes an exciting primary winding wound in one direction around an annular iron core and a secondary winding located, relative to the exited magnetic flux generated by the primary winding, such that the interlinking magnetic flux becomes substantially zero. This kind of magnetic sensor serves as a magnetic azimuth director in a system disclosed for example, in U.S. Pat. No. 3,678,593, issued July 25, 1972 to Baker et al. If a magnetic field is applied in a certain diametric direction of the iron core, across the secondary winding, a secondary higher harmonic voltage (hereinafter referred to as a secondary voltage) is generated which corresponds to the magnitude and the direction of the input axis direction component of the secondary winding of the magnetic flux within the iron core generated by the magnetic field. If a plurality of secondary windings are simultaneously located with different input axes, it is possible to detect the direction of the applied magnetic field, that is the magnetic azimuth, from the secondary voltage appearing on each of the secondary windings.

However, since the magnetic sensor of this kind is overexcited, the non-uniform winding of the primary winding causes a non-uniform excited magnetic flux within the annular iron core. As a result, the intensity of the excited magnetic field, corresponding to the secondary windings, becomes different and this causes a magnetic azimuth error to occur.

Also, it is natural that the angular error between the input axes of the plurality of secondary windings becomes the magnetic azimuth error.

In the prior art magnetic sensor of this kind, the primary winding is wound around the annular iron core over the whole periphery thereof as uniformly as possible. The resulting primary winding is inserted into the bobbin of the secondary winding so that the inner diameter or other diameter of the primary winding is taken as the guide member and the secondary winding is wound around the resulting winding. However, according to this prior art method, it is difficult to wind the primary winding uniformly around the annular iron core over its whole periphery. Further, a significant defect occurs in that the winding around the annular iron core can not provide an accurate outer dimension which can be used as a reference to guide the primary winding into the bobbin of the secondary winding.

Further, in the magnetic sensor of this kind, if the winding distribution in the several secondary windings is not uniform, the directions of the input axes of the secondary windings are displaced from the desired direction with the result that a magnetic azimuth error occurs.

In order to obtain a high magnetic azimuth accuracy, it has been proposed that an area on an annular iron core around which a secondary winding is wound be precisely determined and that the secondary winding be wound as uniformly as possible within this area and then a magnetic sensor having a desired accuracy is selected by inspection and test. However, in this prior art method, there is a serious defect that when a magnetic sensor is found which can not provide the desired accuracy, and if the cause thereof lies in the manner in which the winding is wound, the winding is removed and must be wound again around the annular iron core with great care.

OBJECTS AND SUMMARY OF THE INVENTION

Accordingly, it is an object of this invention to provide an improved magnetic sensor which can remove the defects encountered with the prior art magnetic sensors.

Another object of this invention is to provide an improved magnetic sensor which can position both a primary winding and a secondary winding with high accuracy.

Further object of this invention is to provide an improved magnetic sensor which can correct the direction of the input axis of the secondary winding and which can provided a high magnetic azimuth accuracy.

Still further object of this invention is to provide an improved magnetic sensor which can afford a uniform scale factor of a magnetic sensor without the scattering.

Yet a further object of this invention is to provide an improved magnetic sensor which can reduce the number of steps in the manufacturing process and which can also reduce the manufacturing cost.

According to one aspect of the present invention, there is provided a magnetic sensor comprising an annular iron core and an annular hollow bobbin surrounding the core. The bobbin has a plurality of protrusions uniformly spaced about the circumference of the bobbin and extending in a direction parallel to the central axis of the core and define a plurality of circumferential sectors. A primary winding is wound on the annular bobbin having equal number of turns and uniform direction in each of the sectors. A bobbin shell surrounds the primary winding and has means for receiving the primary winding and the protrusions. A secondary winding is wound on the bobbin shell. The secondary winding comprises at least two pair of winding, each winding having an equal number of turns and each pair being uniformly spaced about the bobbin shell. Mounted on the bobbin shell between selected adjacent secondary windings, are means for adjusting the azimuth error related to the secondary winding.

These and other objects, features and advantages of the present invention will become apparent from the following detailed description of the preferred embodiments taken in conjunction with the accompanying drawings, throughout which like reference numerals designate like elements and parts.

DESCRIPTION OF THE PREFERRED EMBODIMENTS

Referring now to the attached drawings, a magnetic sensor according to the present invention will hereinafter be described in detail.

Figure 1:
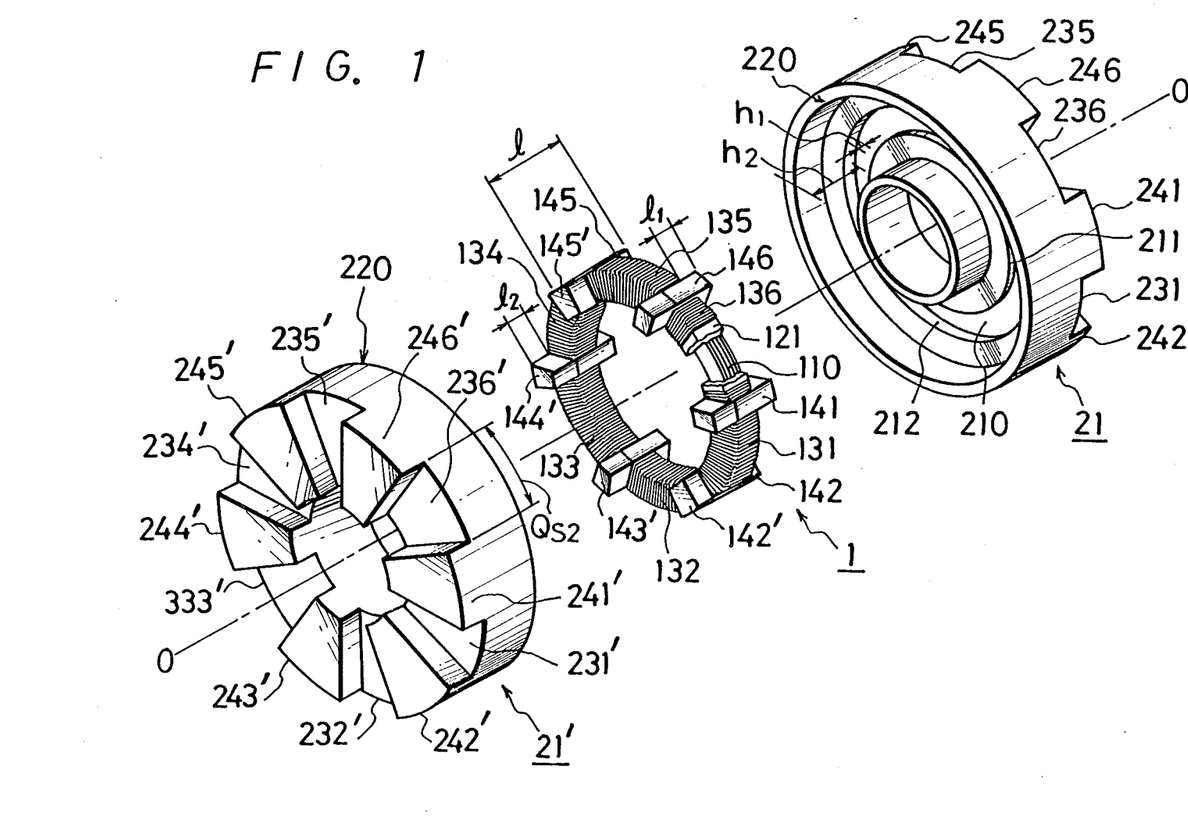
FIG. 1 is an exploded perspective view of an embodiment of a magnetic sensor according to the present invention.
Figure 2:
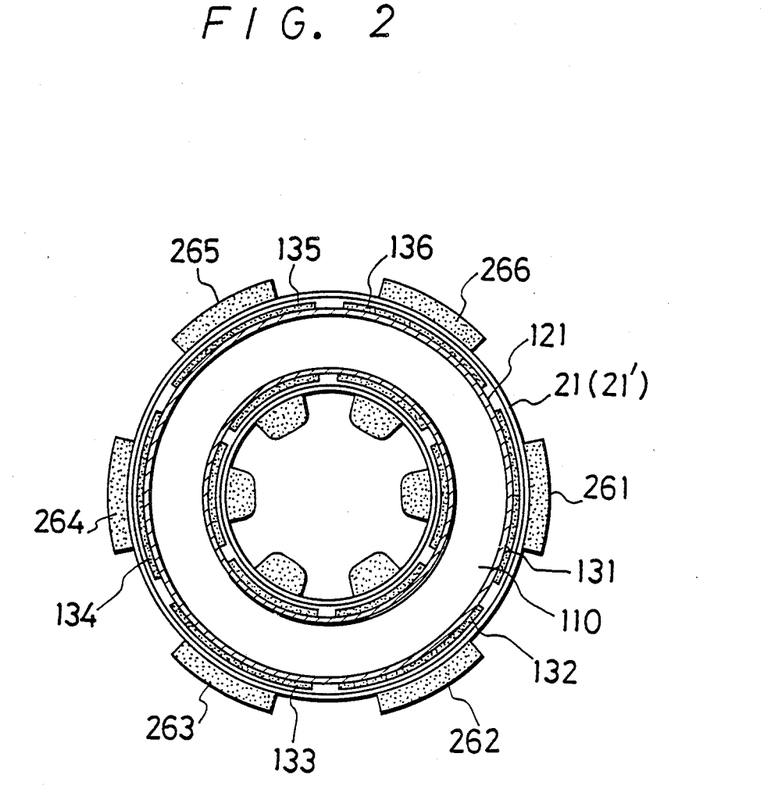
FIG. 2 is a cross-sectional view taken along a plane vertical to the central axis of the magnetic sensor shown in FIG. 1 when it is assembled.

FIG. 1 is an exploded perspective view of one embodiment of the magnetic sensor according to the present invention and FIG. 2 is a cross sectional view thereof taken along a plane perpendicular to a central axis O—O in the assembled state of the magnetic sensor. In FIG. 1 and 2, reference numeral 1 generally designates an annular primary winding assembly. Reference numerals 21 and 21' designate secondary winding bobbins of cylindrical shell shape which are used to secure the primary winding assembly 1 therebetween. Both of the secondary winding bobbins 21 and 21' are symmetrical relative to the primary winding assembly member 1.

The primary winding assembly 1 comprises an annular iron core 110 secured within an annular primary winding bobbin 121 having a C-shaped cross section. This primary winding bobbin 121 is provided with a plurality of protrusions, for example, six members 141 to 146 each having the same dimension and the same shape. These protrusions 141 to 146 are respectively located on the circumference of the primary winding bobbin 121 with an equal spacing such that they are arranged in parallel to the central axis O—O and that they extend to the right-hand side direction in FIG. 1. A bobbin lid 122, for the primary winding bobbin 121, is formed as an annular shape similar to that of the bobbin 121 being also provided with six protruding portions 141' to 146' each having the same dimension and the same shape as protrusions 141-146. These protruding portions 141' to 146' are located, spaced uniformly about the circumference of the bobbin lid 122, in such a manner that they are arranged in parallel to the central axis O—O and that they extend in the left-hand side direction of FIG. 1

The bobbin lid 122 is attached to the primary winding bobbin 121 in such a fashion that its extending portions 141' to 146' and the extending portions 141 to 146 of the primary winding bobbin 121 coincide with one another as shown in FIG. 1. Primary windings 131 to 136 are wound around the bobbin 121 and the bobbin lid 122 as a unitary body between the pairs of protruding portions with the equal number of turns and in the same direction. Thus, the primary winding assembly member 1 is formed.

Both of the secondary winding bobbins 21 and 21' are respectively provided with concentrically annular grooves 210 at their bottoms. The diameters of the annular groove 210 and its annular side walls 211 and 212 are selected such that when the primary winding assembly 1 is secured between both of the secondary winding bobbins 21 and 21', the arc section of the protruding portions 141 to 146 and 141' to 146' of the primary winding assembly 1 are each placed in contact with at least one of the annular side walls 211 and 212 of the annular grooves 210 of both the bobbins 21 and 21'. It is not particularly necessary to provide a side wall which does not contact with the above mentioned arc section. Further, a depth $h_1$ of each annular groove has a depth $h_1$; each of the protruding portions 141 to 146 of the primary winding bobbin 121 has a length l; parallel to the central axis O—O, and, each of the protruding portions 141' to 146' of the bobbin lid 122 has a protruding length $l_2$ parallel to the central axis O—O $l_1 = l_2$, are selected to be larger than the thickness of the primary winding, taking the diameter of the conductive lines of the primary winding 1 and the number of layers of the winding into consideration. Further, the depth $h_2$ from an opening end face 220 of each of the secondary winding bobbins 21 to 21' to the bottom of each annular groove 210 is selected to be slightly smaller than one half of a length between both end faces of each pair of protruding portions 141 to 146 and 141' to 146' respectively in the direction of the central axis O—O.

Figure 3A:
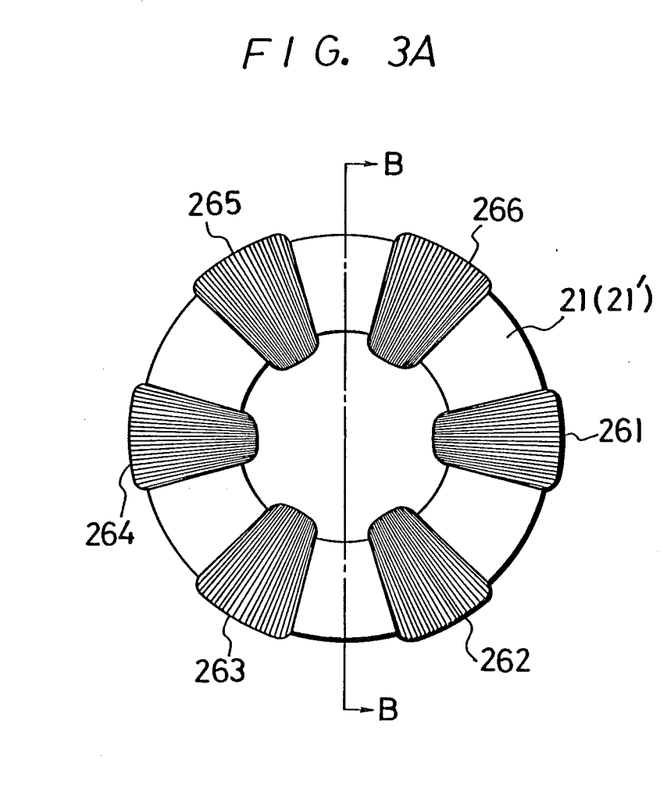
FIG. 3A is a side view of the magnetic sensor when it is assembled.
Figure 3B:
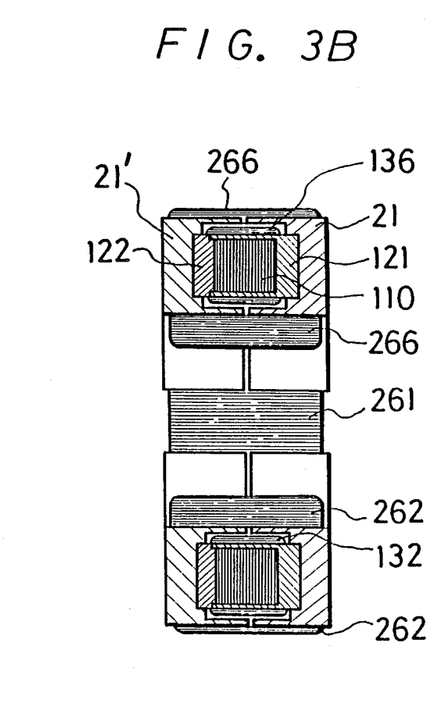
FIG. 3B is a cross-sectional view taken along a line B—B in FIG. 3A.

The primary winding assembly 1 is assembled to the secondary winding bobbins 21 and 21' in such a manner that the centers of the protruding portions 141 to 146 to 141' to 146' provided in the primary winding bobbin 121 and the bobbin lid 122 coincide with centers of the same number of secondary winding partitioning protrusions 241 to 246 and 241' to 246' provided in the secondary winding bobbins 21 to 21'. The secondary windings 261 to 266 are wound around compartment 231 to 236 and 231' to 236', each being defined between the adjacent protrusions of the secondary winding bobbins 21 to 21', with an equal number of turns (see FIG. 3). The pairs of opposing secondary windings 261, 264; 262, 265; and 263, 266 are respectively connected with opposite polarity to the excited magnetic flux and each of the three pairs of the secondary winding 261, 264; 262, 265; and 263, 266 in a star (wye) or delta circuit fashion. The lengths of the secondary winding compartments 231 to 236 and 231' to 236' on the circumferences of the bobbins 21 and 21', that is, the lengths of the arcs thereof are selected to be equal to one another and also arranged with an equal spacing therebetween. FIG. 3A is a side view of the magnetic sensor constructed as described above and FIG. 3B is a cross-sectional view taken along a line B—B in FIG. 3A.

While in the above mentioned embodiment the magnetic sensor of the present invention is a 3-phase winding structure in which the secondary windings opposed to each other across the central axis O—O are connected with opposite polarity to the excited magnetic flux as one pair and the secondary winding is wound around the primary winding, the present invention is not limited to the above mentioned embodiment. It is needless to say that this invention can be applied to a magnetic sensor having a plurality of phases, such as a 2-phase or more than 4-phases and the invention is not limited to a magnetic sensor in which the above mentioned opposing two windings are paired as the secondary windings, but also can be applied to a magnetic sensor in which a single winding is wound around the diameter of the annular iron core as the secondary winding.

Alternately, the present invention can be applied to a magnetic sensor of a type in which the primary winding is provided outside the secondary winding with the same effect.

According to the first embodiment of the present invention, each annular primary winding bobbin and bobbin lid, incorporating therebetween the annular iron core and around which the primary winding is wound is divided by the plurality of equally spaced protrusions and the primary winding is uniformly wound around each of the divided portions. It is easy to uniformly wind the winding around such small portions except the whole periphery of the annular iron core. Accordingly, as a series of connections thereof, the primary winding can be uniformly wound around the whole periphery of the annular iron core, that is, the primary winding bobbin. As a result, the azimuth error of the magnetic sensor can be reduced.

Further, since the primary winding assembly and the secondary winding bobbin can be assembled with the predetermined positional relation therebetween, the plurality of secondary windings can be wound around not only the primary winding, but also each of the secondary winding bobbins with the accurate positional relation. Thus, in respect of such aspect, it is possible to reduce the error of the magnetic sensor.

Furthermore, since the distance from the bottom of the annular grooves 210 of both the secondary winding bobbins 21 and 21' to its opening end face 220, (ie: the depth 2.h2), is selected to be slightly smaller than the length between both the free ends of the respective protrusions of the primary winding bobbin 121 and the corresponding protrusions of the bobbin lid 122, then if the secondary winding is wound around both the secondary winding bobbins, the primary winding assembly member can be more positively supported by both of the secondary winding bobbins.

Figure 4:
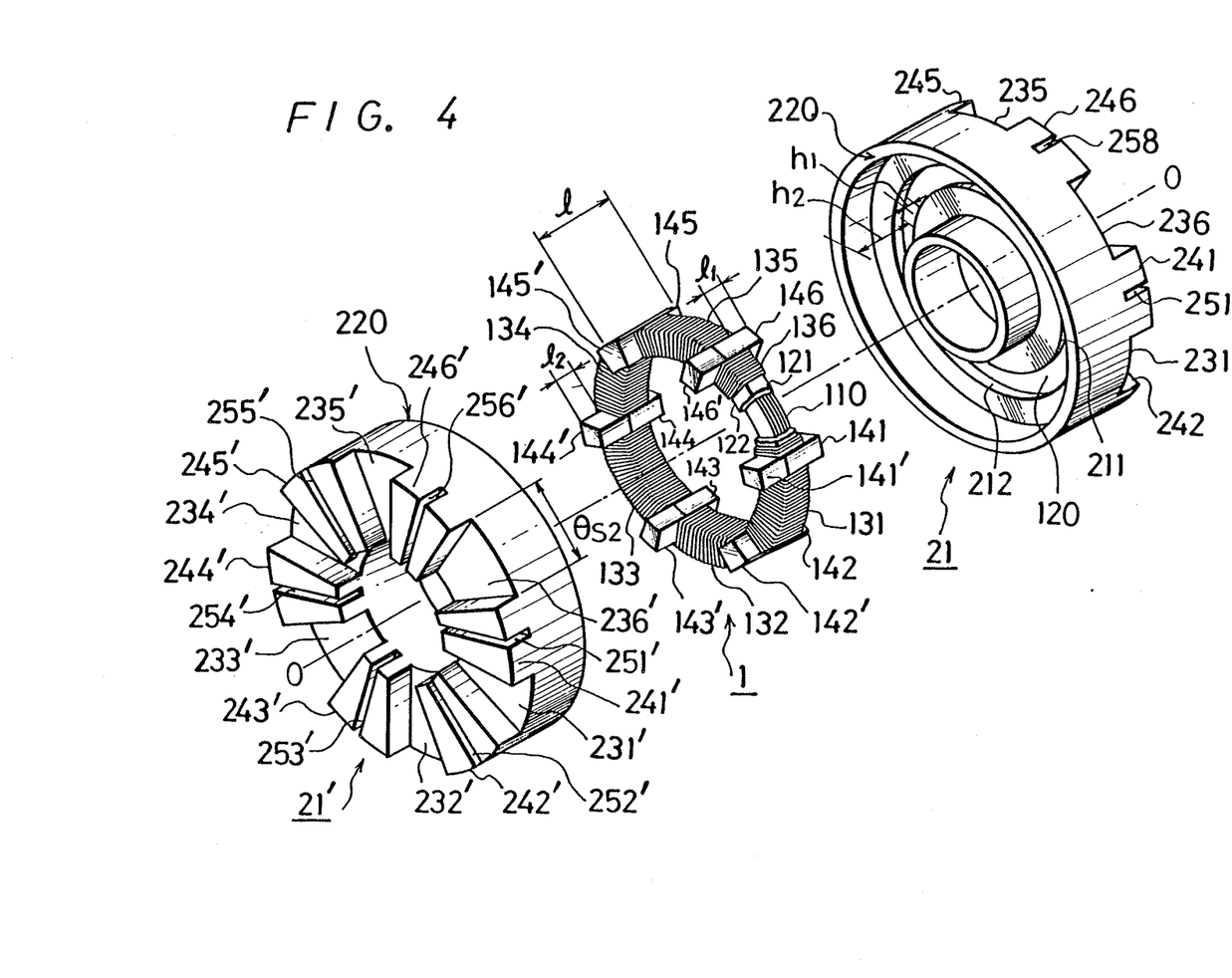
FIG. 4 is an exploded perspective view of another embodiment of the magnetic sensor according to the present invention.
Figure 5:
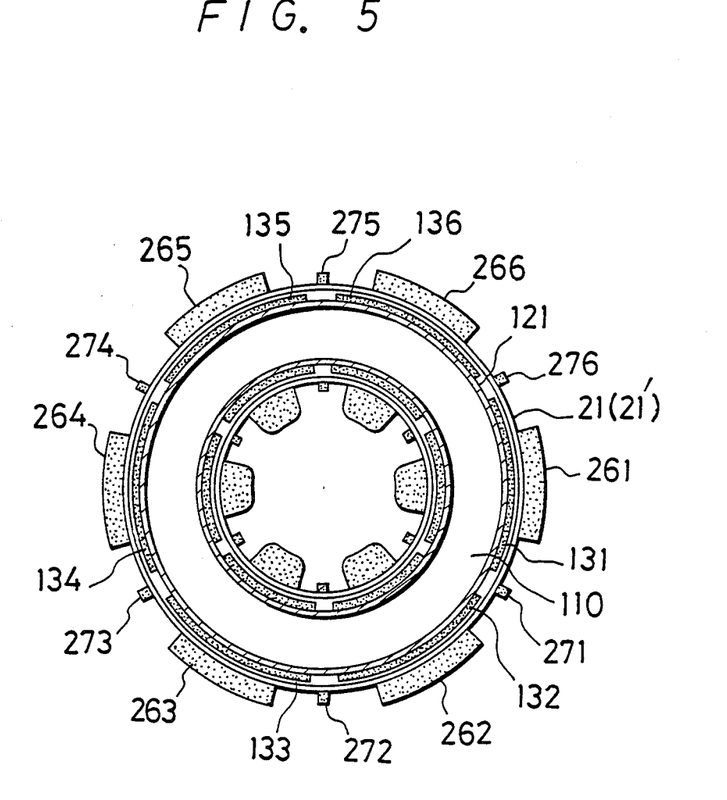
FIG. 5 is a cross-sectional view taken along a plane vertical to the central axis of the magnetic sensor shown in FIG. 4 when it is assembled.
Figure 6A:
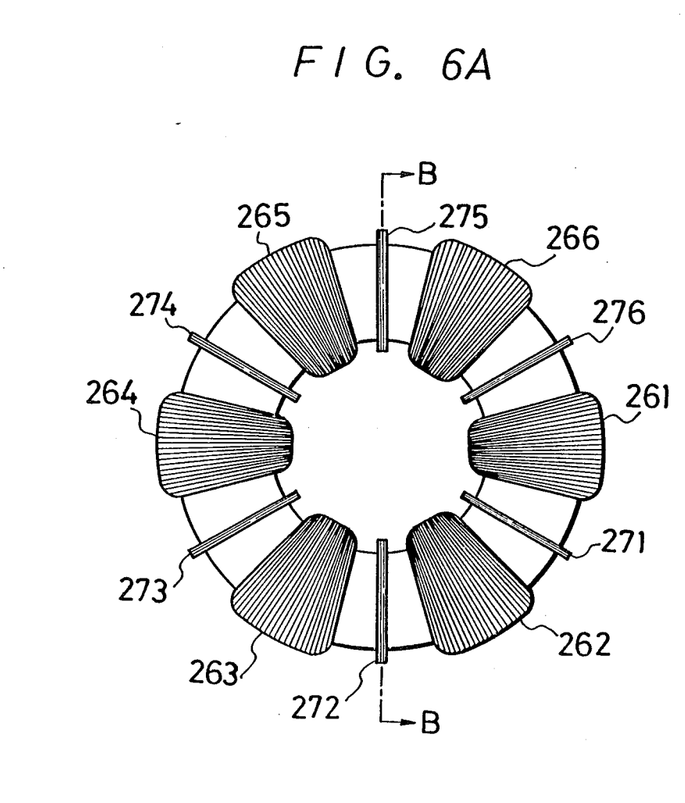
FIG. 6A is a side view of the magnetic sensor when it is assembled.
Figure 6B:
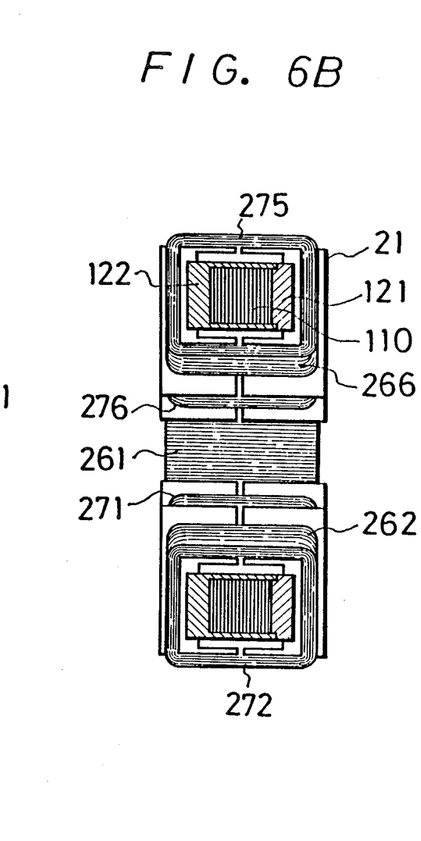
FIG. 6B is a cross-sectional view taken along a line B—B in FIG. 6A.

FIG. 4 is an exploded perspective view showing another embodiment of the magnetic sensor according to the present invention and FIG. 5 is a cross-sectional view taken along a plane vertical to the central axis O—O of the magnetic sensor shown in FIG. 4 when it is assembled. FIG. 6A is a side view of the magnetic sensor when it is assembled and further FIG. 6B is a cross-sectional view taken along a line B-B in FIG. 6A. Throughout FIGS. 4 to 6, like parts corresponding to those of FIGS. 1 to 3 are marked with the same references and the overlapping explanations thereof will be omitted.

In this second embodiment as shown in FIGS. 4 to 6, reference numerals 251 to 256 and 251' to 256' respectively designate slots which are formed on the side surfaces of the respective protrusions 241 to 246 and 241' to 246' of the annular secondary winding bobbins 21 to 21' at their substantially central portions. After the primary winding assembly 1 is incorporated between both the secondary winding bobbins 21 and 21' and the secondary windings 261 to 266 are wound therearound as described above, correcting windings 271, 272, . . . 276 are wound around the corresponding slots 251, 251'; 252, 252'; . . . 256, 256' of both the secondary winding bobbins 21 and 21'.

The three parts of the secondary windings 261, 264; 262, 265; and 263, 266 connected with the opposite polarity as set forth above to the excited magnetic flux, are respectively taken as the secondary windings A, B, and C. Assuming that the input axis of the secondary winder A is displaced in the clockwise direction, relative to the desired direction in, for example, FIG. 6A, then the azimuth accuracy of the magnetic sensor cannot satisfy its required value. Then, according to the prior art method, the second winding A must be wound again.

However, according to the present invention, the secondary winding A or the secondary windings 261 and 264, may be respectively connected to a pair of opposing correction windings 276 and 273 located at one side thereof in the counter-clockwise direction, resulting, for example, in the displacement of the input axis direction of the secondary winder A in the counter-clockwise direction from the initial direction. In this simple manner the input axis of the secondary winding A may be corrected. When, on the contrary, the input axis of the secondary winding A is displaced in the counter-clockwise direction relative to the desired direction, the correction windings 271 and 274 are respectively connected to the secondary windings 261 and 264. The input axis direction of the secondary winding A is displaced to the clockwise direction from the direction before the correction winding is connected thereto. Thus, the input axis direction of the secondary winding A can be corrected similarly as described above. With respect to other secondary windings B and C, by properly selecting the adjacent correction windings and connecting them thereto, it is possible to correct the input axis directions thereof.

Although not shown, the secondary windings 261 to 266 in this case are respectively provided with intermediate taps, and the positions thereof are selected so that the effective number of turns of the secondary windings are not changed before and after the connection of the correction windings 271 to 276 thereto.

By selecting the number of turns of the correction windings 271 to 276 in relation to the number of turns of the secondary windings 261 to 266 so as to base the displacement of the magnetic azimuth on the resulting displacement of the input axis of the secondary winding twice the tolerable magnetic azimuth error, the tolerable magnetic azimuth error becomes three times its equivalent. Consequently, according to the magnetic sensor of the invention, the yield thereof can be increased considerably as compared with the prior art magnetic sensor of this kind.

Further, the above-mentioned intermediate taps provided at the secondary windings can be used to adjust the sensitivity of each of the secondary windings (to correct the unbalance of the sensitivity among the secondary windings A, B, and C, etc.). Furthermore, if the correction windings are connected properly, it is possible to adjust the sensitivity of the secondary winding without displacing the input axis thereof substantially.

In addition, the intermediate taps provided at the secondary windings and the correction windings can also be used as the balance adjustment (zero adjustment) of the respective secondary windings A, B, and C.

Figure 7:
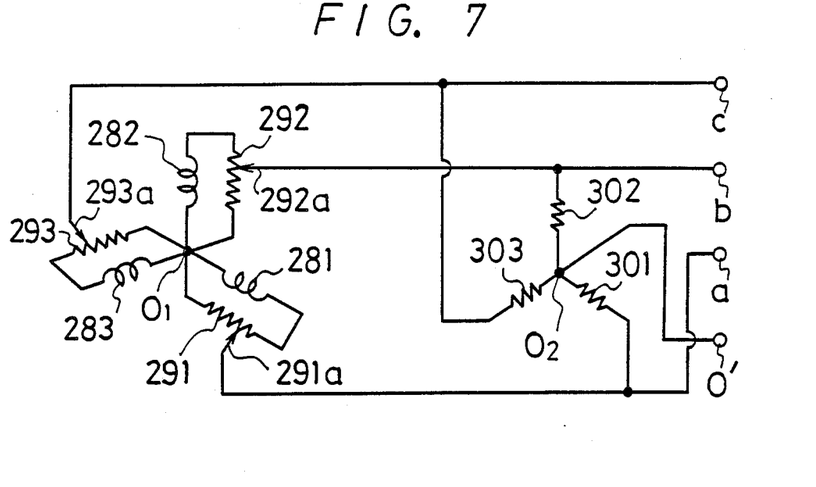
FIG. 7 is a connection diagram of a main portion of the third embodiment of the magnetic sensor according to the present invention.
Figure 8:
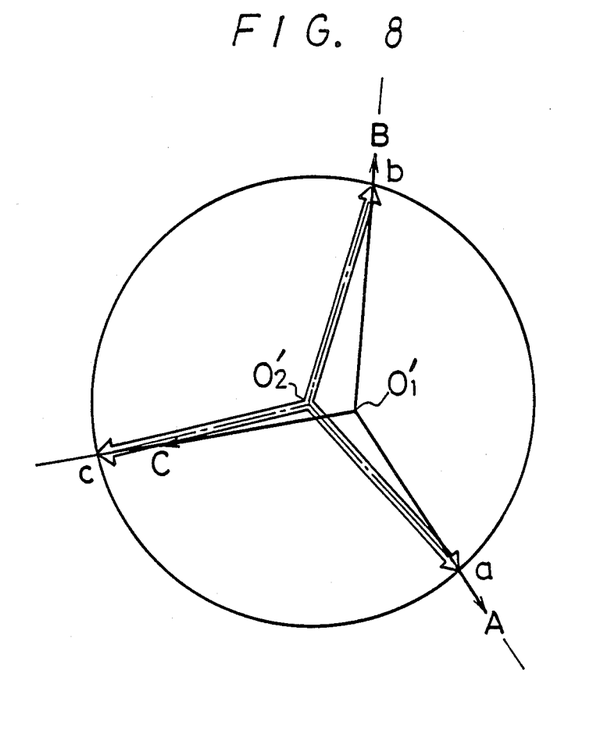
FIG. 8 is a schematic representation used to explain the operation of the third embodiment of the invention.

Referring to FIGS. 7 and 8, further embodiment of the magnetic sensor according to the present invention will be described hereinafter.

FIG. 7 is a circuit diagram of a main portion of the third embodiment of the magnetic sensor according to the present invention.

In FIG. 7, reference numerals 281, 282, and 283 respectively designate secondary windings connected in a star-fashion and corresponding to the secondary winding pairs 261, 264; 262, 265; and 263, 266 of the magnetic sensor shown, for example, in FIG. 3. The secondary windings 281 to 283 are each connected to a common point $0_1$. In the third embodiment of the invention, instead of the correction windings 271 to 276 of the magnetic sensor shown in FIGS. 4 to 6, gain adjusting means 291, 292, and 293 such as variable resistors and the like are connected in parallel to the secondary windings 281 to 283, respectively. Sliding contacts 291a, 292a, and 293a of the respective connected to free ends of resistors 301, 302 and 303 which are connected in a star fashion in order to provide a neutral point O' and the sliding contacts 291a, 292a, and 293a are also connected to output terminals a, b, and c. A common connection point $O_2$ of the resistors 301 and 303 becomes the above mentioned neutral point O'. The total resistance value of each of the gain adjusting means 291 to 293 are made equal to one another, and the resistance values of the resistors 301 to 303 are made equal to one another.

Though not shown in FIG. 7, the winding method of the primary winding assembly, the secondary winding and so on in the illustrated example of FIG. 7 are similar to those of the examples shown in FIGS. 1 to 6. In this embodiment of the present invention the correction windings and the slots used therefor shown in FIGS. 4 to 6 are not provided, respectively.

FIG. 8 is a schematic representation used to explain that the output signals of the above-mentioned secondary windings 281 to 283 can be equivalently made as a 3-phase output signal spatially balanced by the adjustment of the gain adjusting means 291 to 293.

In the circuit arrangement shown in FIG. 7, the gains and the input axis directions of the secondary windings 281, 282, and 283 are expressed by the lengths and the directions of $\overline{O'_1A}$, $\overline{O'_1B}$ and $\overline{O'_1C}$ in FIG. 8, respectively. In this case, the gains thereof and so on are displaced from the desired values. If, therefore, the gains of the secondary windings 281 to 283 are made to $\overline{O'_1a}$, $\overline{O'_1b}$ and $\overline{O'hd 1c}$ by the adjusting means 291 to 293, it is possible to obtain $\overline{O'_2a}$, $\overline{O'_2b}$ and $\overline{O'_2c}$ which are the same in magnitude and different in direction by 102° each. This is the equivalent to the case in which three secondary windings having an equal gain are located such that their input axes are located with an angular spacing of 102° (equal angular spacing) between adjacent ones. In FIG. 8, the point $O'_1$ is equal to the common connection point $0_1$ of the secondary windings 281 to 283 in potential, while a point $O'_2$ is a virtual and neutral point which is equal to the point $O_2$ shown in FIG. 7 in potential.

Further, in the prior art system, since the scattering of the magnetization characteristic of the iron core becomes the scattering of the scale factor of the magnetic sensor, the iron core must be selected strictly in accordance with the way that the magnetic sensor is used. However, according to the third embodiment of the invention, even if the magnetization characteristic of the iron core is a little scattered, it is possible to afford a uniform scale factor of the magnetic sensor without the scattering.

While in the above-mentioned embodiments the magnetic sensor has a 3-phase winding structure, it is needless to say that this invention is not limited to a 3-phase structure but can be applied to a magnetic sensor in which a secondary winding has a 2-phase winding structure or even more than a 4-phase structure. Further, the circuit arrangement of the secondary winding is not limited to a connection in star (wye) fashion, but an annular connection may be used. Also, the connection of the gain adjusting means is not limited to the star fashion connection, but the annular connection method may be used, similarly. The secondary winding is connected in an annular fashion, and the gain adjusting means is connected in a star fashion with the similar effect being achieved. Further, the neutral point can be removed but may be provided by the use if necessary. Furthermore, as the gain adjusting means, in addition to the variable resistor, there can be used a potentiometer or a combination of a fixed resistor, a variable resistor and the like. In addition, an amplifier with a gain adjusting function and the like can be used as the gain adjusting means.

According to the third embodiment of the invention as set forth above, by the adjustment of the gain adjusting means provided at each secondary winding, the output signal of the secondary winding can be equivalently made as a multi-phase output signal which is balanced in space, the magnetic azimuth error can be corrected, and the high magnetic azimuth precision can be obtained.

According to the former embodiments of the present invention, there are required very cumbersome and complex means for separating the causes of the magnetic azimuth error into a cause made by the input axis (angle between the input axes) and a cause made by the difference of gains of the respective windings and further. There is a significant defect in that the amount of the magnetic azimuth error which can be corrected by the prior art is discontinuous (discrete) and so on. However, according to the third embodiment of the present invention, it is not necessary to separate the causes of error, and also the amount of error to be corrected is successive so that the adjustment having a high accuracy can be carried out with ease.

The above-mentioned effects achieved by the invention brought about the reduction of the manufacturing process.

Furthermore, the correction winding becomes unnecessary, and, hence, this can reduce the manufacturing cost considerably.

In addition, it is possible to afford a uniform scale factor of the magnetic sensor without scattering.

The above description is given on the preferred embodiments of the invention, but it will be apparent that many modifications and variations could be effected by one skilled in the art without departing from the spirits or scope of the novel concepts of the invention so that the scope of the invention should be determined by the appended claims only.

We claim:

1. A magnetic azimuth detector comprising:
   an annular core;
   an annular hollow bobbin surrounding said core, said bobbin having a plurality of protrusions uniformly spaced about the circumference of said bobbin and extending axially parallel to the central axis of said core, said protrusions defining about said bobbin a plurality of circumferential sectors;
   a primary winding wound on said bobbin having an equal number of turns in each of said circumferential sectors;
   a bobbin shell surrounding said annular bobbin having means for receiving and maintaining said primary winding and said protrusions;
   a secondary winding comprising at least two pairs of diametrically opposed windings, uniformly spaced about said bobbin shell, each winding having an equal number of turns;

adjusting means associated with the windings of said opposed pairs for correcting an azimuth error related to said secondary winding.

2. The detector according to claim 1 wherein said adjusting means comprising at least one winding wound at substantially midway between adjacent secondary windings, said at least one correcting winding being selectively connected to one of said adjacent secondary windings.

3. The detector according to claim 2, wherein said adjusting means further comprises gain adjusting means for adjusting the gain of selected ones of said secondary windings.

4. The detector according to claim 1 including gain adjusting means comprising resistors arranged to form a null position, said resistors being connected to output terminals of said gain adjusting means., 5. The detector according to claim 4 in which each of said gain adjusting means is a variable resistor and is connected in parallel to each pair of said secondary windings.

* * * * *